United States Patent [19]

Lew

[11] Patent Number: 4,723,535
[45] Date of Patent: Feb. 9, 1988

[54] SOLAR TRAP

[76] Inventor: Hyok S. Lew, 7890 Oak St., Arvada, Colo. 80005

[21] Appl. No.: 659,227

[22] Filed: Oct. 9, 1984

Related U.S. Application Data

[60] Continuation-in-part of Ser. No. 335,805, Dec. 30, 1981, Pat. No. 4,494,529, which is a division of Ser. No. 95,535, Nov. 11, 1979, abandoned, which is a continuation-in-part of Ser. No. 574,529, May 5, 1975, abandoned.

[51] Int. Cl.[4] .................................................. F24J 3/02
[52] U.S. Cl. .................................... 126/439; 126/440; 126/441; 350/445
[58] Field of Search .................. 126/439, 440, 441; 350/445, 452

[56] References Cited

U.S. PATENT DOCUMENTS

| | | | |
|---|---|---|---|
| 3,869,199 | 3/1975 | Cummings | 350/630 |
| 4,011,855 | 3/1977 | Eshelman | 126/441 X |
| 4,069,812 | 1/1978 | O'Neill | 126/439 X |
| 4,092,979 | 6/1978 | Kotlarz | 126/440 X |
| 4,230,094 | 10/1980 | Szulmayer | 126/439 |

Primary Examiner—Larry Jones
Assistant Examiner—Allen J. Flanigan

[57] ABSTRACT

This invention relates to a solar energy collecting device that concentrates the intensity of the sunlight by funneling the sunlight with one or more light funnels having a substantially V-shaped cross section made of light reflecting surfaces. The sunlight funneled to the apex zone of the light funnel is absorbed by one or more substantially flat fins radially extending a short distance from a conduit and dividing the wedge angle of the light funnel. The sunlight absorbed by the light absorbing fins heats the heat transfer fluid moving through the conduit disposed adjacent and parallel to the apex line of the light funnel. The opening of the diverging end of the light funnel is covered with a simple transparent cover or a two dimensional Fresnel lens cover. The solar trap may be used independently as a solar energy concentrating and collecting device or in conjunction with prefocusing reflectors or lenses.

4 Claims, 18 Drawing Figures

SOLAR TRAP

This application is a continuation-in-part of patent application Ser. No. 335,805, filed 12/30/81, now U.S. Pat. No. 4,494,529, which is a division of patent application Ser. No. 095,535, filed 11/11/79, now abandoned, which is a continuation-in-part of patent application Ser. No. 574,529, filed 5/5/75, now abandoned.

BACKGROUND OF THE INVENTION

Every day the sun supplies an immense amount of energy to the earth. Unfortunately, the intensity of the solar energy falling on the earth is not high enough for most solar collectors to convert it into a useful form of work in many demanding applications. The higher the intensity of the solar energy collected, the greater its applications are. The flat solar collectors widely used at the present time provide applications no better than heating dwelling spaces and hot water for domestic uses. The present day technology for collecting solar energy at a significantly elevated temperature is limited to parabolic reflectors and focusing lenses, which are expensive, complex and cumbersome technologies which are neither promising nor encouraging in terms of their present status and their future potential. One of the most typical examples of solar energy application is to use solar energy for air conditioning in the tropical and subtropical regions where the expense of cooling in summer time is far greater than the expense of heating in winter time. The use of solar energy for the cooling of living space is an extremely attractive concept in view that the greatest amount of cooling is required when the greatest amount of solar energy is available, which combination virtually eliminates all necessity of storage means for storing solar energy. The disappointing truth is that, at the present time, there is no inexpensive solar collector available that is suitable for using solar energy in air conditioning.

SUMMARY OF THE INVENTION

The primary object of the present invention is to provide a concentrating solar collector that collects and delivers solar energy at a high intensity level.

Another object of the present invention is to provide a concentrating solar collector that needs not track the daily movement of the sun in nontracking installations and that tolerates a sizable tracking error in tracking installations.

A further object of the present invention is to provide a concentrating solar collector that is inexpensive, structurally simple and operationally trouble-free.

Yet another object of the present invention is to provide a concentrating solar collector employing the sunlight funneling trough comprising of one or more pairs of light-reflecting surfaces arranged in a substantially V-shaped cross section.

Yet a further object of the present invention is to provide a concentrating solar collector comprising of one or more light funnels and one or more substantially flat heat absorbing fins radially extending from one or more conduits disposed adjacent and parallel to the apex line of the light funnel wherein said conduit carries a heat transfer fluid.

Still another object of the present invention is to provide a two dimensional light funnel covered with a two dimensional Fresnel lens cover.

Still a further object of the present invention is to provide a light funnel directing sunlight to a one sided photovoltaic cell panel disposed in the apex zone of the light funnel that faces the opening of the light funnel.

These and other objects of the present invention will become clear as the description thereof proceeds.

BRIEF DESCRIPTION OF FIGURES

The present invention may be described with a greater clarity and specificity by referring to the following figures.

DESCRIPTION OF PREFERRED EMBODIMENTS

Figure 1:
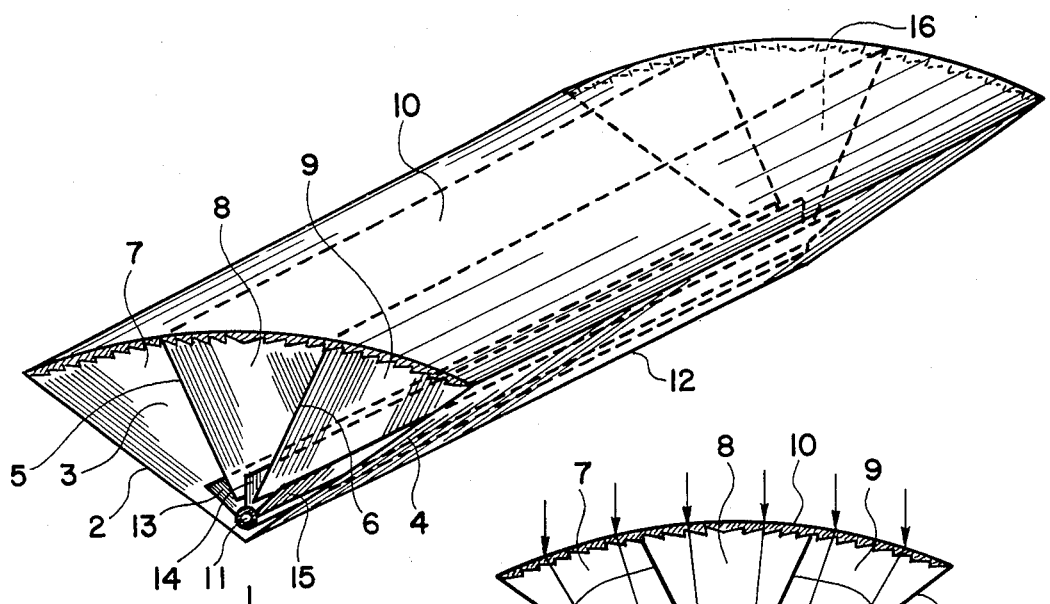
FIG. 1 illustrates a perspective view of an embodiment of the solar trap having compound light funnel with Fresnel lens cover.

In FIG. 1 there is illustrated a perspective view of a section of a solar trap 1 composed of a compound light funnel 2 made of a pair of one sided reflecting surfaces 3 and 4 arranged in a substantially V-shaped cross section and a pair of dual sided reflecting surfaces 5 and 6 subdividing the compound light funnel made of the reflecting surfaces 3 and 4 into a plurality of sub-light funnels 7, 8, 9, etc. The opening at the diverging end of the compound light funnel 2 is covered wtih a two dimensional Fresnel lense cover 10. A conduit 11 for carrying a heat transfer fluid is disposed adjacent and parallel to the apex line 12 of the compound light funnel 2. The conduit 11 includes a plurality of substantially flat light absorbing fins 13, 14, 15, etc. radially extending a short distance from the conduit 11, each of which fins divides the wedge angle of each of the sub-light funnels 7, 8, 9, etc. The heat absorbing fins 7, 8, 9, etc. and the outer surface of the conduit 11 may be coated with a black coating enhancing the absorption of the sunlight. The one end 16 and the other end opposite thereto may be covered with transparent or reflecting or any other sheets or plates.

Figure 2:
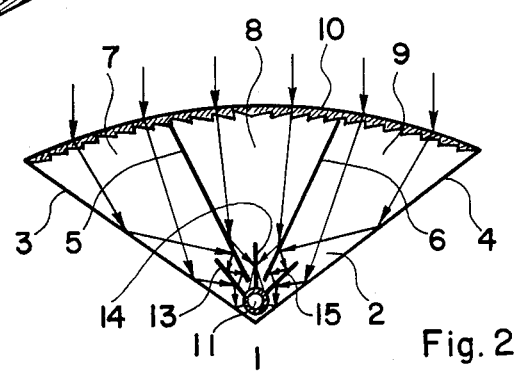
FIG. 2 illustrates a cross section of the solar trap shown in FIG. 1.

In FIG. 2 there is shown a cross section of the wide angle solar trap 1. The Fresnel lens cover 10 deflects the sunlight generally towards the general vicinity of the apex zone of the compound light funnel 2. The sunlight deflected by the Fresnel lens cover 10 as it enters the light funnel 2 irradiates the light reflecting surfaces 3, 4, 5, 6, 7, etc. at reasonably sharp angles and is funneled toward the apex zone of the compound light funnel 2 as the sunlight is reflected back and forth between each adjacent pair of light reflecting surfaces constituting each of the sub-light funnels forming the compound light funnel 2. The sunlight funneled to the apex zone of the compound light funnel 2 is absorbed by a plurality of substantially flat sunlight absorbing fins 13, 14, 15, etc. radially extending a short distance from the conduit 11 and heats the heat transfer fluid moving through the conduit 11. Each of the heat absorbing fins 14, 15, 16, etc. divides the wedge angle of each of the sub-light funnels 7, 8, 9, etc. The wedge angle is the angle between two adjacent reflecting surfaces constituting a light funnel or a sub-light funnel. It is important to understand that the particular arrangement of the sunlight absorbing fins 13, 14, 15, etc. in conjunction with the light reflecting surfaces 3, 4, 5, 6, etc. as shown in FIG. 2 drastically enhances the absorption of the sunlight by the light absorbing fins, as the portion of the sunlight not absorbed on initial irradiation on the light absorbing fin is reflected back to the light absorbing fin by the adjacent light reflecting surface which process repeats over and over untill the last portion of the sunlight is absorbed. This enhanced absorption process is called the enhanced absorption by repeated irradiation process.

Figure 3:
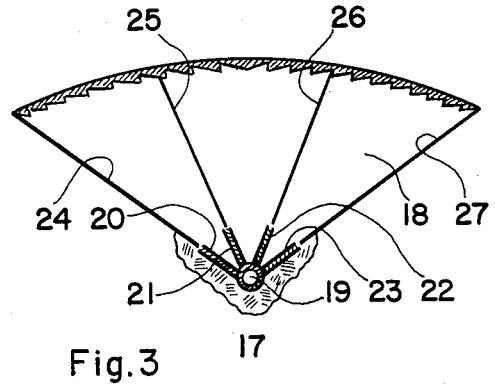
FIG. 3 illustrates a cross section of another embodiment of the solar trap having a compound light funnel with Fresnel lens cover.

In FIG. 3 there is shown a cross section of a solar trap 17 composed of a compound light funnel 18 including essentially the same elements and construction as the compound light funnel 2 of FIG. 1 and a heat transfer fluid conduit 19 having light absorbing fins arranged differently from those shown in FIG. 2. Each of a plurality of substantially flat light absorbing fins 20, 21, 22, 23, etc. radially extending a short distance from the conduit 19 is substantially lined up with each of a plurality of light reflecting surfaces 24, 25, 26, 27, etc. included in the compound light funnel 18. The conduit 11 may be insulated to prevent heat loss to the ambient atmosphere. The solar trap shown in FIG. 3 works in the same principle as that shown in FIG. 2.

Figure 4:
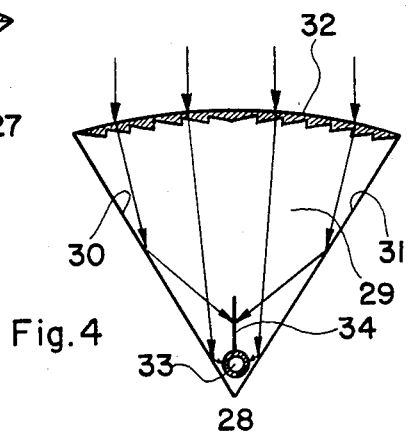
FIG. 4 illustrates a cross section of a further embodiment of the solar trap.

In FIG. 4 there is shown a cross section of a solar trap 28 including a simple light funnel 29 composed of a pair of one-sided reflecting surfaces 30 and 31 arranged in a substantially V-shaped cross section, and a two dimensional Fresnel lens cover 32 covering the funnel opening of the diverging end. A conduit 33 carrying the heat transfer fluid is disposed adjacent and parallel to the apex line of the simple light funnel 29. A substantially flat light absorbing fin 34 radially extending a short distance from the conduit 33 divides the wedge angle of the simple light funnel 29. The Fresnel lens cover 32 deflects the sunlight entering the simple light funnel 29 generally towards the apex zone of the simple light funnel 29. The sunlight funneled to the apex zone of the simple light funnel 29 by the reflecting surfaces 30 and 31 is absorbed by the light absorbing fin 34 in a repeated irradiation process as explained in conjunction with FIG. 2 and heats the heat transfer fluid moving through the conduit 33.

Figure 5:
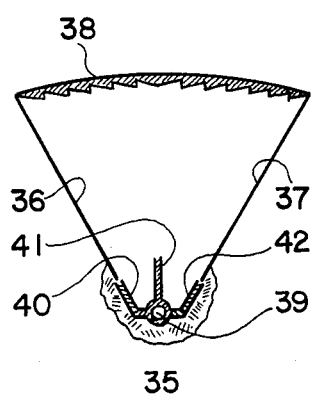
FIG. 5 illustrates a cross section of yet another embodiment of the solar trap.

In FIG. 5 there is shown a cross section of a solar trap 35 including a simple light funnel made of two reflecting surfaces 36 and 37 and a Fresnel lens cover 38 covering the top opening. The conduit 39 has three light absorbing fins 40, 41 and 42 radially extending a short distance therefrom. The light absorbing fin 41 in the middle divides the wedge angle of the simple light funnel, while the light absorbing fins 40 and 42 are disposed on the same planes as those including the reflecting surfaces 36 and 37, respectively. The solar trap 35 works in the same principles as that shown in FIG. 4.

Figure 6:
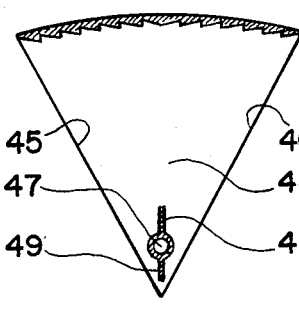
FIG. 6 illustrates a cross section of yet a further embodiment of the solar trap.

In FIG. 6 there is shown a cross section of a solar trap 43 comprised of a simple light funnel 44 including a pair of light reflecting surfaces 45 and 46, and a Fresnel lens cover 47. The heat transfer fluid conduit 47 includes a pair of light absorbing fins 48 and 49 radially extending a short distance in two diametrically opposite directions there-from wherein the light absorbing fins divide the wedge angle of the light funnel.

Figure 7:
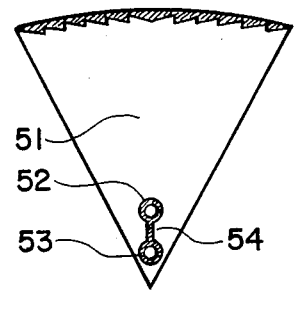
FIG. 7 illustrates a cross section of still another embodiment of the solar trap.

In FIG. 7 there is shown a cross section of a solar trap 50 including a simple light funnel 51 of the same construction as that in FIG. 6 and further including a pair of heat transfer fluid conduits 52 and 53 interconnected by a substantially flat web 54 which divides the wedge angle of the simple light funnel 51.

Figure 8:
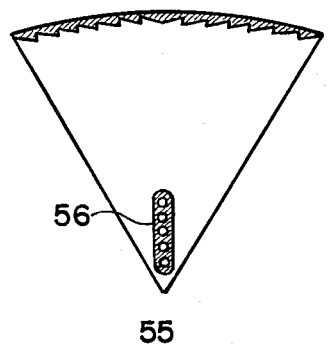
FIG. 8 illustrates a cross section of still a further embodiment of the solar trap.

In FIG. 8 there is shown a cross section of a solar trap 55 having essentially the same construction as that shown in FIG. 7 with one exception being that a pluralities of the heat transfer fluid conduits are included in a flat elongated bar 56 that divides the wedge angle of the simple light funnel.

Figure 9:
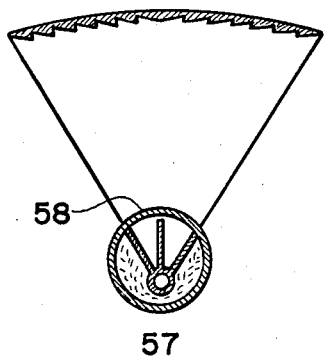
FIG. 9 illustrates a cross section of additionally another embodiment of the solar trap.

In FIG. 9 there is shown a solar trap 57 including essentially the same elements and same arrangements as that shown in FIG. 5 with one exception being that the combination of the heat transfer fluid conduit and the light absorbing fins radially extending therefrom is enclosed within a transparent tube 58. The transparent tube 58 may be evacuated to cut off the heat loss from the heat transfer fluid conduit to the ambient atmosphere.

Figure 10:
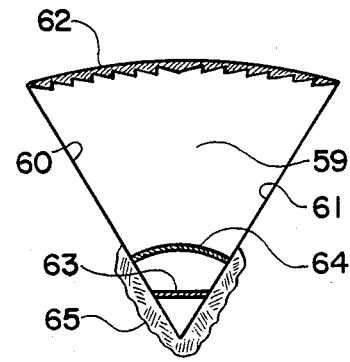
FIG. 10 illustrates a cross section of additionally a further embodiment of the solar trap.

In FIG. 10 there is illustrated a cross section of a simple light funnel 59 made of a pair of reflecting surfaces 60 and 61, and Fresnel lens cover 62. A one sided photovoltaic cell panel 63 is disposed adjacent and parallel to the apex line of the simple light funnel 59, which is disposed to face the opening of the simple light funnel 59. This combination generates direct current electricity from the sunlight. By adding a transparent partition 64 that separates the apex zone from the rest of the space within the simple light funnel 59 and disposing means for circulating air through the apex zone isolated by the transparent partition 64 and insulated by an insulating material 65, the solar trap shown in FIG. 10 can be converted to a dual function solar trap that generates electricity and provides heat tranferred by air circulated through the enclosed apex zone.

Figure 11:
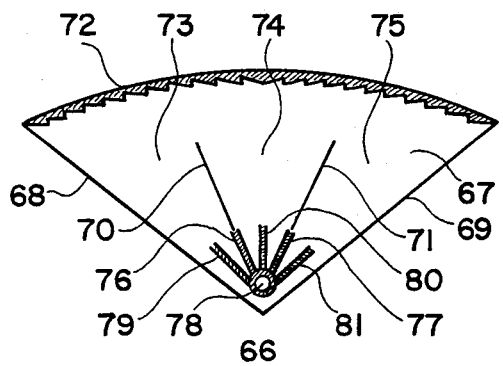
FIG. 11 illustrates a cross section of a solar trap employing a wide angle light funnel.

In FIG. 11 there is shown a cross section of a solar trap 66 comprised of a compound light funnel 67 including a pair of one sided reflecting surfaces 68 and 69, a plurality of dual sided reflecting surfaces 70, 71, etc. and a Fresnel lens cover 72. The dual sided reflecting surfaces 70, 71, etc. which create sub-light funnels 73, 74, 75, etc. within the wide angle light funnel 67, are affixed to the tips of the light absorbing fins 76, 77, etc. radially extending a short distance from the heat transfer fluid conduit 78, respectively, wherein the dual sided reflecting surfaces 70, 71, etc extend radially just far enough to funnel the sunlight deflected by the Fresnel lens cover 72. The conduit 78 includes a further plurality of light absorbing fins 79, 80, 81, etc. radially extending a short distance therefrom and dividing the wedge angles of the sub-light funnel 73, 74, 75, etc. respectively.

Figure 12:
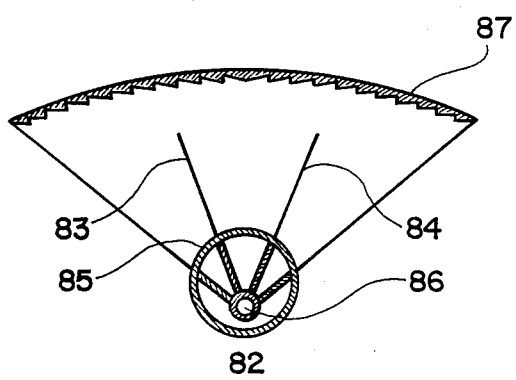
FIG. 12 illustrates a cross section of another solar trap employing a wide angle light funnel.

In FIG. 12 there is shown a cross section of a solar trap 82 having the same elements and the same arrangements as that shown in FIG. 3 with one exception being that the dual sided reflecting surfaces 83 and 84 affixed to the transparent tube 85 extend radially just far enough to funnel the sunlight deflected by the Fresnel lens cover 87. The combination of the heat transfer fluid conduit 86 and the light absorbing fins radially extending therefrom is enclosed within the transparent tube 85. The inside of the transparent tube 85 may be evacuated to prevent heat loss to the ambient atmosphere.

Figure 13:
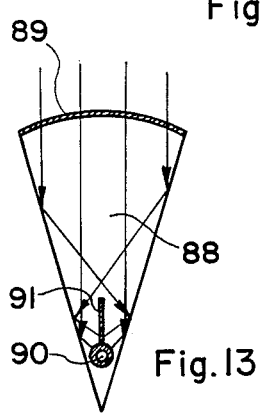
FIG. 13 illustrates a cross section of an embodiment of the simple solar trap having a simple transparent cover.

In FIG. 13 there is shown a cross section of a solar trap 87 including a simple light funnel 88, a plain transparent cover 89 and a conduit 90 with a light absorbing fin 91. The plain light funnel 88 without the Fresnel lens cover must have a wedge angle less than thirty five degrees in order to funnel the sunlight to the apex zone of a light funnel having a sizable depth.

Figure 14:
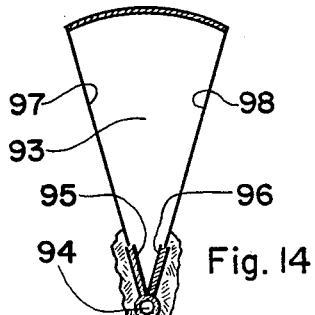
FIG. 14 illustrates a cross section of another embodiment of the simple solar trap.

In FIG. 14 there is illustrated a cross section of a solar trap 92 including a plain light funnel 93 without a Fresnel lens cover and a heat transfer fluid conduit 94 disposed at the apex line of the light funnel in a substantially coaxial relationship. A pair of light absorbing fins 95 and 96 extend radially a short distance from the conduit 94 in directions coinciding with the pair of the light reflecting surfaces 97 and 98 of the plain light funnel 93, respectively. The heat transfer fluid conduit 94 and the light absorbing fins 95 and 96 are insulated.

Figure 15:
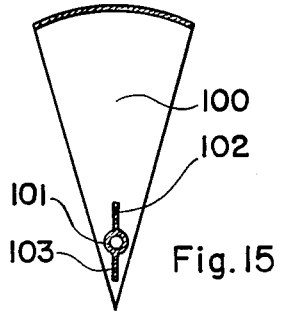
FIG. 15 illustrates a cross section of a further embodiment of the simple solar trap.

In FIG. 15 there is shown a cross section of a solar collector 99 comprised of a plain light funnel 100 and a heat transfer fluid conduit 101 having a pair of light absorbing fins 102 and 103 radially extending a short distance in two diametrically opposite directions therefrom and dividing the wedge angle of the plain light funnel 100.

Figure 16:
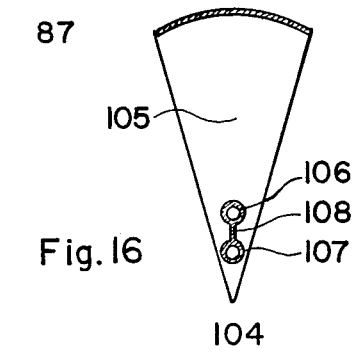
FIG. 16 illustrates a cross section of yet another embodiment of the simple solar trap.

In FIG. 16 there is illustrated a cross section of a solar collector 104 including a plain light funnel 105 and a pair of conduits 106 and 107 interconnected by a light absorbing web 108 that divides the wedge angle of the plain light funnel 105.

Figure 17:
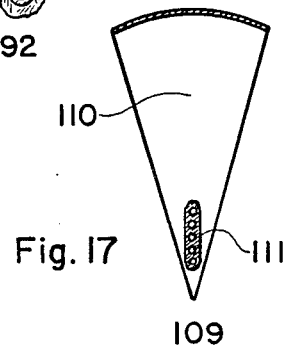
FIG. 17 illustrates a cross section of yet a further embodiment of the simple solar trap.

In FIG. 17 there is shown a cross section of a solar collector 109 including a plain light funnel 110 and a plurality of heat transfer fluid conduits disposed through a flat bar 111 dividing the wedge angle of the plain light funnel 110.

Figure 18:
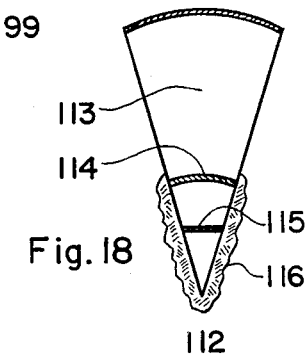
FIG. 18 illustrates a cross section of still another embodiment of the simple solar trap.

In FIG. 18 there is shown a cross section of a dual function solar collector 112 including a plain light funnel 113, a transparent partition 114 isolating the apex zone of the plain light funnel 113, one sided photovoltaic cell panel 115 facing the opening of the plain light funnel 113 and an insulating material 116 insulating the apex zone of the plain light funnel 113 including the photovoltaic cell panel 115. The one sided photovoltaic cell panel 115 generates electricity and air circulated through the isolated apex zone of the plain light funnel 113 provides heat.

While the principles of the present invention have now been made clear by the illustrative embodiments, it will be immediately obvious to those skilled in the art that many modifications of the structure, arrangements, elements, proportions and materials which are particularly adapted to a certain working environment and operating condition in the practice of the invention are possible without departing from those principles of the present invention.

I claim:

1. A solar trap for collecting solar energy at a concentrated level comprising:

(a) a compound light funnel including a pair of light reflecting substantially planar members arranged into a trough having a substantially V-shaped cross section; and one or more dual sided light reflecting planar members disposed radially intermediate said pair of light reflecting substantially planar members, said one or more dual sided light reflecting planar members dividing said substantially V-shaped cross section comprising said pair of light reflecting substantially planar members into a plurality of sublight funnels having a substantially V-shaped cross section.

(b) a two dimensional Fresnel lens cover covering the opening of said compound light funnel, said opening being the open diverging end of said substantially V-shaped cross section of said compound light funnel;

(c) at least one conduit for carrying a heat transfer fluid disposed substantially adjacent and substantially parallel to the apex line of said compound light funnel, said at least one conduit having at least two substantially flat light absorbing axial fins extending radially outward a short distance from said at least one conduit towards said Fresnel lens cover; whereby said two dimensional Fresnel lens cover refracts the sunlight falling thereon generally towards said apex zone, and said plurality of sublight funnels further aid in funneling the sunlight towards said apex zone; each of said at least two light absorbing axial fins forming an acute angle with respect to the nearest adjacent light absorbing axial fin, whereby a portion of radiation falling upon one of said at least two light absorbing axial fins which is reflected rather than absorbed will either be reflected back towards said light absorbing axial fin by an adjacent light reflecting surface or will be absorbed or reflected back towards said light absorbing axial fin by an adjacent light absorbing surface.

2. The combination as set forth in claim 1 wherein the combination of said at least one conduit and said at least two light absorbing axial fins is enclosed within a transparent tube.

3. The combination as set forth in claim 2 wherein inside of said transparent tube is evacuated.

4. The combination as set forth in claim 1 wherein the apex zone of said compound light funnel is insulated by an insulating material.

* * * * *